US010595440B2

United States Patent
Starkovich et al.

(10) Patent No.: US 10,595,440 B2
(45) Date of Patent: Mar. 17, 2020

(54) THERMAL GASKET WITH HIGH TRANSVERSE THERMAL CONDUCTIVITY

(71) Applicant: Northrop Grumman Systems Corporation, Falls Church, VA (US)

(72) Inventors: John A. Starkovich, Redondo Beach, CA (US); Edward M. Silverman, Encino, CA (US); Andrew D. Kostelec, Fullerton, CA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 15/910,191

(22) Filed: Mar. 2, 2018

(65) Prior Publication Data
US 2019/0274234 A1 Sep. 5, 2019

(51) Int. Cl.
*H05K 7/20* (2006.01)
*F28F 21/02* (2006.01)
*F28F 3/00* (2006.01)
*F28F 13/00* (2006.01)
(Continued)

(52) U.S. Cl.
CPC ........... *H05K 7/20436* (2013.01); *F28F 3/00* (2013.01); *F28F 21/02* (2013.01); *H01L 23/373* (2013.01); *H01L 23/3737* (2013.01); *H01L 23/433* (2013.01); *F28F 2013/006* (2013.01)

(58) Field of Classification Search
CPC ........ H05K 7/20436; F28F 3/00; F28F 21/02; F28F 2013/006
See application file for complete search history.

(56) References Cited

U.S. PATENT DOCUMENTS 4,256,792 A * 3/1981 Koepke ................. C04B 35/111
174/16.3
5,660,917 A * 8/1997 Fujimori ............. H01L 23/3677
165/185
(Continued)

FOREIGN PATENT DOCUMENTS

JP  H05 209157 A   8/1993
JP  H06 299129    10/1994
(Continued)

OTHER PUBLICATIONS

Notification of Transmittal of the International Search Report and the Written Opinion of the International Searching Authority, or the Declaration issued in related U.S. Appl. No. PCT/US2019/019586, dated May 22, 2019, 12 pages.

*Primary Examiner* — Jon T. Schermerhorn, Jr.
(74) *Attorney, Agent, or Firm* — McCracken & Gillen LLC

(57) ABSTRACT

An exemplary passive heat transfer apparatus is suited for transferring heat away from an electronic heat generating device to another environment. A gasket has many spaced-apart holes that are transverse to two major opposing surfaces of the gasket. A thermally conductive material is disposed within and fills the holes for conducting heat from one of the two major surfaces to the other major surface. The thermally conductive material is a nanocomposite material having nano-particles aligned substantially perpendicular to the two major opposing surfaces. The thermally conductive material as disposed in the holes has no interfacial boundaries that could adversely affect the transfer of heat.

19 Claims, 2 Drawing Sheets

(51) Int. Cl.
*H01L 23/373* (2006.01)
*H01L 23/433* (2006.01)

(56) References Cited

U.S. PATENT DOCUMENTS

| | | | | |
|---|---|---|---|---|
| 6,242,799 | B1 * | 6/2001 | Horiuchi | H01L 23/564 |
| | | | | 257/700 |
| 7,303,005 | B2 * | 12/2007 | Reis | H01L 23/3677 |
| | | | | 165/185 |
| 7,459,112 | B2 * | 12/2008 | Chu | H01L 23/373 |
| | | | | 257/E23.09 |
| 10,184,734 | B2 * | 1/2019 | Liu | F28F 21/02 |
| 2003/0060108 | A1 | 3/2003 | Chu et al. | |
| 2007/0244245 | A1 * | 10/2007 | Liu | B82Y 30/00 |
| | | | | 524/496 |
| 2011/0030938 | A1 * | 2/2011 | Liu | F28F 21/02 |
| | | | | 165/185 |
| 2013/0170171 | A1 | 7/2013 | Wicker et al. | |
| 2014/0374080 | A1 * | 12/2014 | Hill | H05K 7/20472 |
| | | | | 165/185 |
| 2017/0005026 | A1 * | 1/2017 | Starkovich | H01L 23/3737 |

FOREIGN PATENT DOCUMENTS

| | | | |
|---|---|---|---|
| JP | H06299129 A | * | 10/1994 |
| WO | 2012143923 | | 10/2012 |
| WO | 2016146374 | | 9/2016 |

\* cited by examiner

THERMAL GASKET WITH HIGH TRANSVERSE THERMAL CONDUCTIVITY

BACKGROUND

This invention relates generally to the transfer of heat away from a heat generating object, e.g. active semiconductor device, to prevent undesired heat buildup at the device. More specifically, the invention relates to compliant sheet-like gaskets that engage a device to be cooled and facilitate the effective transfer of heat away from the device.

An increasing number of electronic circuits utilize integrated circuits (ICs) or active semiconductor devices to perform a variety of functions. As the density of such devices on wafers and/or printed circuit boards increase, the heat generated from the devices also increases. This gives rise to the use of heat sinks to transfer this heat away from the devices in order to limit the temperature at which the devices operate. One type of a traditional heat sink consists of a block of metal with a flat surface mounted to the device and an opposing surface with an irregular surface, e.g. fins, to maximize the surface area exposed to air or other environment to which the heat is to be transferred. However, with the amount of heat generated per square area for such devices increasing due to increased density of devices, there is a need for improved structures that more efficiently transfer heat away from heat generating devices.

SUMMARY

It is an object of the present invention to satisfy this need.

An exemplary passive heat transfer apparatus is suited for transferring heat away from an electronic heat generating device to another environment. A gasket has many spaced-apart holes that are transverse to two major opposing surfaces of the gasket. A thermally conductive material is disposed within and fills the holes for conducting heat from one of the two major surfaces to the other major surface. The thermally conductive material is a nanocomposite material having nano-particles aligned substantially perpendicular to the two major opposing surfaces. The thermally conductive material as disposed in the holes has no internal interfacial boundaries that could adversely affect the transfer of heat.

Another exemplary apparatus includes an electronic heat generating device from which heat is to be removed, the exemplary passive heat transfer apparatus, and a heat absorber to which the heat is transferred.

An exemplary method is used to make a passive heat transfer apparatus suited for transferring heat away from an electronic heat generating device to another environment. A sheet-like gasket is manufactured with a plurality of spaced-apart holes that are transverse to two major opposing surfaces. A heat conductive nanocomposite material having nano-dimension particles, preferably with large aspect ratios, aligned substantially perpendicular to the two major opposing surfaces is injected into the holes so that no interfacial boundaries are formed within the material as disposed within the holes. The material conducts heat from one of the two major surfaces to the other major surface.

DESCRIPTION OF THE DRAWINGS

Features of exemplary implementations of the invention will become apparent from the description, the claims, and the accompanying drawings in which:

DETAILED DESCRIPTION

Figure 1:
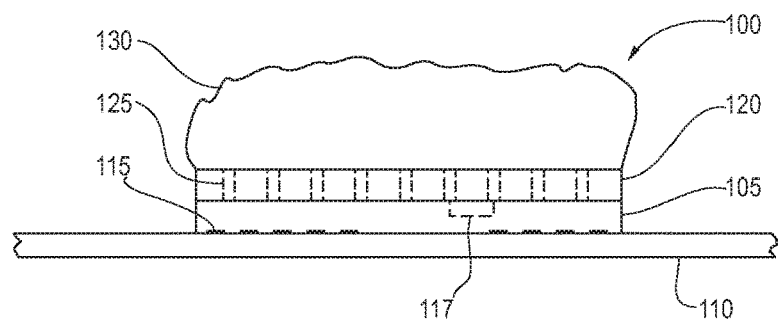
FIG. 1 is a side view of an exemplary apparatus that incorporates an embodiment of the present invention.

FIG. 1 shows a side view of an exemplary apparatus 100 that incorporates an embodiment of the present invention. In this exemplary embodiment, a heat generating device 105, e.g. an integrated circuit, solid state laser, active antenna elements, etc., is mounted to a printed circuit board 110 by a plurality of metallic contacts 115. The heat generating device 105 contains a substantial plurality of closely spaced active devices 117, each of which contributes to the total heat generated by device 105. Such devices 117 may create a very high power density that gives rise to a correspondingly high heat load. A sheet-like gasket 120 has a bottom surface that is mounted to the top surface of the heat generating device 105 and includes a plurality of spaced apart heat transfer elements 125 that extend between the two major surfaces of the gasket 120 and are distributed throughout the area of the gasket 120. The top surface of the gasket 120 is abutted by a heat absorbing environment 130 which may consist of a further heat transferring element and/or a variety of fluids or liquids utilized to transfer heat away from and/or absorb the heat from the heat generating device 105. The gasket 120 is preferably, but exclusively, fabricated using a 3D printing method.

Figure 2:
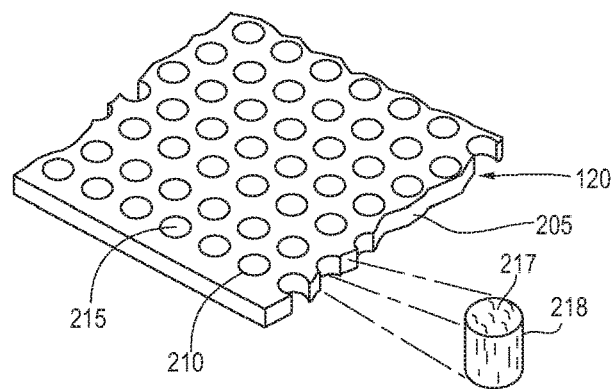
FIG. 2 is a perspective view of an exemplary heat transfer gasket in accordance with an embodiment of the present invention with an enhanced view of one of the heat conductive elements.
Figure 3:
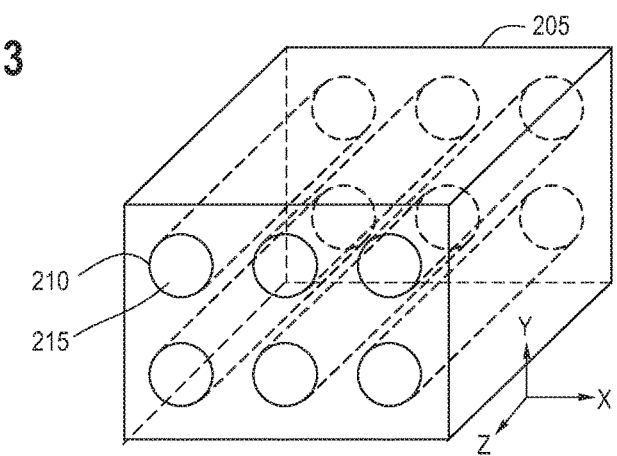
FIG. 3 is shows an exploded portion of the exemplary heat transfer gasket.

FIG. 2 shows a perspective view of the exemplary passive heat transfer gasket 120 and FIG. 3 shows an exploded portion of it. "Passive" refers to the absence of a liquid or gas in the gasket to effectuate the transfer of heat. The gasket 120 may be formed of thermoplastic elastomer materials, e.g. polyolefin, polyurethane, polyester, and polyamide and has a Swiss cheese structure in which a plurality of spaced apart holes 210 traverse from one major surface to the opposing major surface. Each of the holes 210 is filled with a material 215 having high transverse thermal conductivity, i.e. having a high thermal conductivity along the z axis which is perpendicular to the major surfaces of the gasket 120.

Preferably the material 215 is a highly thermal conducting nanocomposite material. The nanocomposite consists of large aspect ratio nanoparticles, e.g. particles with one dimension that is 10 to 10,000 times that of the other dimension, of high thermal conductivity such as cabon nanotube (CNT) yarns, graphene fibers, metal nanowires (Ag, Au, Cu), and ceramic nanowiskers (AlN, SiC, $Al_2O_3$, graphite) preferentially aligned and oriented in thermoplastic elastomer filament. One aspect resides in the longitudinally aligned (perpendicular to the major surfaces of the gasket) nano-particles 217 shown in the enhanced view of the exemplary material 218 (one of materials 215). Another aspect is that the material 215 is disposed within the respective holes to eliminate interfacial boundaries along the z-axis. An aspect of the present invention resides in the recognition that disposing the material 215 within the respective holes in sequential multiple horizontal layers (disposing layers parallel to the major surfaces of the gasket) such as by layer by layer 3D printing or layer by layer deposition gives rise to interfacial boundaries that occur at the interface between adjacently formed layers. Although a sequential multilayer deposition may not reduce in-plane thermal conductivity, i.e. thermal conductivity along planes parallel to the interfacial boundaries, multiple interfacial boundaries dramatically reduce transverse the heat conductivity, i.e. heat conductivity perpendicular to the interfacial boundary layers. Therefore, it is desirable to manufacture the gasket 205 with its holes 210, and then subsequently fill the respective holes 210 with the materials 215 so that, for each hole, all of the material 215 is inserted at substantially one time as one step to eliminate the formation of any interfacial boundary transverse to the z-axis exists. Interfacial boundaries refer to discontinuous boundaries formed internally within the conductive element 215 between the two distal faces that are substantially level with the respective two major surfaces of the gasket material 205. Thickness of the thermal gaskets prepared can range from approximately 50 micrometers (0.002 inch) to over 300 micrometers (0.012 inch).

Figure 4:
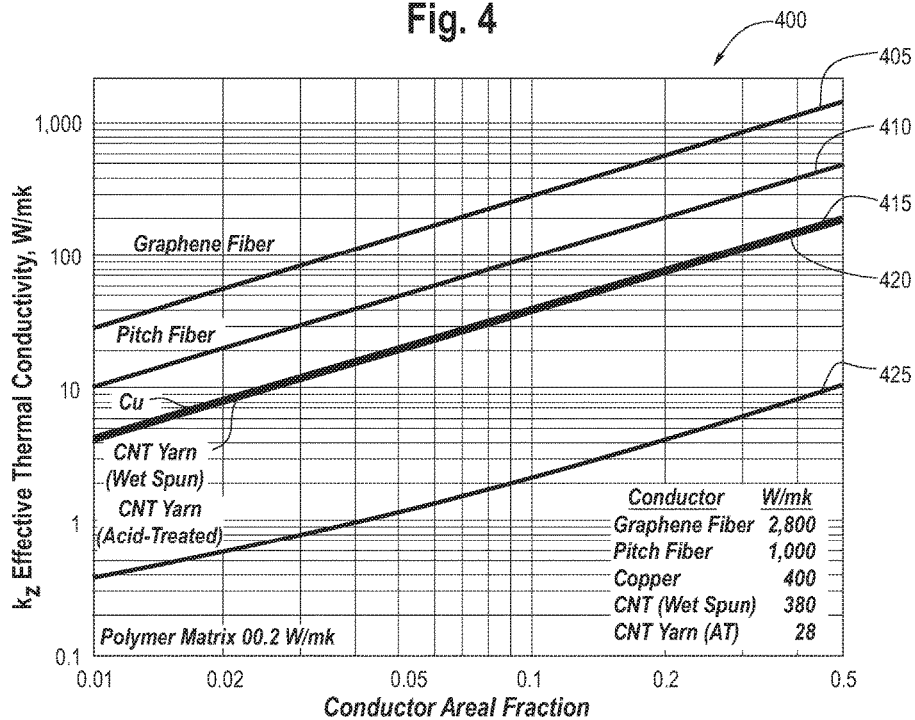
FIG. 4 is a graph showing thermal conductivity versus relative area of the heat transfer elements to the total area of the gasket for different materials.

FIG. 4 is a graph 400 showing thermal conductivity for different materials 215 versus the conductor areal fraction (the total area of the heat transfer elements 215 on one surface of the gasket 120 to the total surface area of one surface of the gasket). The lower right inset chart shows representative thermal conductivity in units of watts per meter Kelvin (W/mK) for Graphene Fiber, Pitch Graphite Fiber, Copper, carbon nanotubes (CNT) wet spun, and CNT Yarn acid treated (AT) materials with corresponding respective curves 405, 410, 415, 420 and 425 in the graph. These graphs represent values for the respective materials with no internal interfacial discontinuity. As an example for interpreting the graphs, a gasket made using Pitch Graphite Fiber material at 0.5 conductor areal fraction, meaning that half of the surface area of one major surface of the gasket is occupied by the area of Pitch Graphite Fiber, has a thermal conductivity of about 500 W/mK. For the same areal fraction, Graphene Fiber has a thermal conductivity of about 1,500 W/mK.

Figure 5:
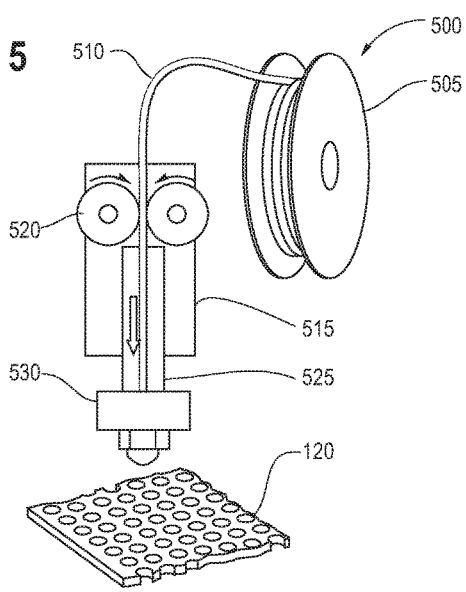
FIG. 5 depicts an exemplary apparatus for manufacturing the exemplary heat transfer gasket in accordance with an embodiment of the present invention.

FIG. 5 depicts an exemplary apparatus 500 for manufacturing the exemplary heat transfer gasket 120. The gasket 120, prior to receiving the material 215, may be manufactured by a 3D printing process to form a polymer film with vias (through holes). A spool 505 contains a continuous filament 510 of the material 215 (preferably nanoparticle composite material) to be inserted into the respective holes in the gasket material. A feed controller 515 controls the feeding of the filament and includes feed rollers 520 that friction feed the filament through a hollow inside a guide tube 525. The filament is directed through a nozzle 530, which may be a heated high sheer extrusion nozzle, which liquefies the filament and "spurts" or flows the liquid material 215 in one continuous step into a respective hole 210 maintaining nanoparticle alignment. Thus, the material is deposited within the hole as one effective layer to avoid the formation of any interfacial discontinuities within the material as finally disposed within the hole. The material then solidifies within the hole. It is envisioned that this process is repeated to fill each respective hole with the material; either the gasket or the feed controller/nozzle can be moved and positioned over each respective hole. An exemplary thermoplastic nanocomposite filament diameter that can be used for filling the vias or holes may range from 0.5 mm (0.02 inch) to over 3 mm (0.012 inch). It is desirable to fill the vias or holes so that no excess material projects from the gasket. If some slight overfill is present, gasket surfaces could be sanded or burnished to remove overfill material and furnish a filled gasket with smooth planar surfaces.

Although exemplary implementations of the invention have been depicted and described in detail herein, it will be apparent to those skilled in the art that various modifications, additions, substitutions, and the like can be made without departing from the spirit of the invention. The scope of the invention is defined by the following claims.

The invention claimed is:

1. A passive heat transfer apparatus suited for transferring heat away from an electronic heat generating device to a heat dissipation device, the apparatus comprising:
   a non-metallic gasket having a plurality of spaced-apart holes that are transverse to two major opposing surfaces;
   thermally conductive material disposed within and filling the holes for conducting heat from one of the two major surfaces to the other major surface, the thermally conductive material being a nanocomposite material having nano-particles having an aspect ratio between longitudinal and width dimensions with the longitudinal dimension being greater than the width dimension, the nano-particles aligned with the longitudinal dimension substantially perpendicular to the two major opposing surfaces, a plurality of the nano-particles having ends positioned to engage a surface of the heat dissipation device while the other major surface of the thermally conductive material engages the surface of the heat dissipation device, the nano-particles having no internal interfacial boundaries between the major opposing surfaces, wherein a higher thermal conductivity than copper is achieved.

2. The passive heat transfer apparatus of claim 1 wherein the apparatus has a thermal conductivity greater than 400 W/mK.

3. The passive heat transfer apparatus of claim 2 wherein the thermally conductive material consists of one of pitch graphite fiber and graphene fiber.

4. The passive heat transfer apparatus of claim 1 where the total surface area of the thermally conductive material on one of the two major surfaces of the gasket is half of the total surface area of the one major surface and the gasket provides an effective transverse thermal conductivity of greater than 400 W/mK.

5. The passive heat transfer apparatus of claim 1 wherein the large aspect ratio has a longitudinal to width dimension of at least 10 to 1, respectively, of the nano-particles.

6. The passive heat transfer apparatus of claim 1 wherein the thermally conductive material that fills the holes is made of a non-conductive thermoplastic elastomer material into which the nano-particles are disposed.

7. An electronic apparatus comprising:
   an electronic heat generating device having a planar surface;
   a sheet-like gasket having a plurality of spaced-apart holes that are transverse to two major opposing surfaces, one of the two major opposing surfaces engaging the planar surface;
   thermally conductive material disposed within and filling the holes that conducts heat from the one major surface to the other major surface of the two opposing major surfaces, the thermally conductive material being a nanocomposite material having nano-particles having an aspect ratio between longitudinal and width dimensions with the longitudinal dimension being greater than the width dimension, the nano-particles aligned with the longitudinal dimension substantially perpendicular to the two major opposing surfaces, the nano-particles having no interfacial boundaries between the major opposing surfaces;

a heat absorber that engages the other major surface and ends of a plurality of the nano-particles, the heat absorber accepting heat transferred via the thermally conductive material from the electronic heat generating device, thereby transferring heat away from the electronic heat generating device, wherein a higher thermal conductivity than copper is achieved by the gasket with thermally conductive material filling the holes in the gasket.

8. The electronic apparatus of claim 7 wherein the apparatus has a higher thermal conductivity than 400 W/mK.

9. The electronic apparatus of claim 8 wherein the thermally conductive material consists of one of pitch graphite fiber and graphene fiber.

10. The electronic apparatus of claim 7 where the total surface area of the thermally conductive material on one of the two major surfaces of the gasket is half of the total surface area of the one major surface and the gasket provides an effective transverse thermal conductivity of greater than 400 W/mK.

11. The electronic apparatus of claim 7 where the large aspect ratio has a longitudinal to width dimension of at least 10 to 1, respectively, of the nano-particles.

12. The electronic apparatus of claim 7 wherein the thermally conductive material that fills the holes is made of a non-conductive thermoplastic elastomer material into which the nano-particles are disposed.

13. A method for making a passive heat transfer apparatus as defined in claim 1 suited for transferring heat away from an electronic heat generating device to a heat dissipation device, the method comprising the steps of:

manufacturing a sheet-like gasket having a plurality of spaced-apart holes that are transverse to two major opposing surfaces;

injecting a heat conductive nanocomposite material having nano-particles aligned substantially perpendicular to the two major opposing surfaces into the holes so that ends of a plurality of the nano-particles engage a surface of the heat dissipation device while one of the two major opposing surfaces of the heat conductive nanocomposite material engages the surface of the heat dissipation device, no interfacial boundaries being formed within the material as disposed within the holes, the material conducting heat from one of the two major surfaces to the other major surface, wherein a higher thermal conductivity than copper is achieved by the passive heat transfer apparatus.

14. The method of claim 13 wherein the injecting step comprises liquefying a filament of heat conductive nanocomposite material and filling each respective hole with the liquefied material so that the entirety of the material within the hole is formed as a single layer step to eliminate the possibility of interfacial boundaries in the material.

15. The method of claim 14 wherein the liquefying is performed by heated extrusion of the filament.

16. The method of claim 15 wherein the injected material consists of one of pitch graphite fiber and graphene fiber.

17. The method of claim 13 wherein the thermally conductive material has a higher thermal conductivity than 400 W/mK.

18. The method of claim 13 includes the step of transferring heat with an effective thermal conductivity of greater than 400 W/mK when the total surface area of the thermally conductive material on one of the two major surfaces of the gasket is half of the total surface area of the one major surface.

19. The method of claim 13 wherein the gasket is manufactured with one of the two major surfaces of the gasket being flat for engaging a surface of the electronic heat generating device.

* * * * *